US011343458B2

(12) United States Patent
Sugawa et al.

(10) Patent No.: US 11,343,458 B2
(45) Date of Patent: May 24, 2022

(54) LIGHT-RECEIVING DEVICE AND METHOD FOR READING OUT SIGNAL OF LIGHT-RECEIVING DEVICE

(71) Applicant: TOHOKU UNIVERSITY, Miyagi (JP)

(72) Inventors: Shigetoshi Sugawa, Miyagi (JP); Rihito Kuroda, Miyagi (JP)

(73) Assignee: TOHOKU UNIVERSITY, Miyagi (JP)

( * ) Notice: Subject to any disclaimer, the term of this patent is extended or adjusted under 35 U.S.C. 154(b) by 293 days.

(21) Appl. No.: 16/615,647

(22) PCT Filed: Apr. 23, 2018

(86) PCT No.: PCT/JP2018/016450
§ 371 (c)(1),
(2) Date: Nov. 21, 2019

(87) PCT Pub. No.: WO2018/221074
PCT Pub. Date: Dec. 6, 2018

(65) Prior Publication Data
US 2020/0177831 A1      Jun. 4, 2020

(30) Foreign Application Priority Data
May 28, 2017   (JP) .............................. JP2017-105134

(51) Int. Cl.
*H04N 5/378* (2011.01)
*G01J 1/46* (2006.01)
*H04N 5/372* (2011.01)

(52) U.S. Cl.
CPC .............. *H04N 5/378* (2013.01); *G01J 1/46* (2013.01); *H04N 5/372* (2013.01)

(58) Field of Classification Search
CPC ............ H04N 5/378; H04N 5/372; G01J 1/46
See application file for complete search history.

(56) References Cited

U.S. PATENT DOCUMENTS 7,924,334 B2 *  4/2011  Gomi ................... H04N 5/3765
                                                        348/308
8,624,308 B2 *  1/2014  Oshikubo .......... H04N 5/37452
                                                        257/292
(Continued)

FOREIGN PATENT DOCUMENTS

JP    2005-328493 A    11/2005
JP    2006-060569 A     3/2006
(Continued)

OTHER PUBLICATIONS

Translation of JP-2006060569-A (Year: 2006).*
(Continued)

*Primary Examiner* — Nicholas G Giles
(74) *Attorney, Agent, or Firm* — Greenblum & Bernstein, P.L.C.

(57) ABSTRACT

A light-receiving device that achieves both high saturation performance and high sensitivity performance includes a light-receiving pixel including a light-receiving element, a first capacitive element that accumulates a photoelectric charge produced by light received by the light-receiving element, a second capacitive element that accumulates a transferred portion of an amount of the photoelectric charge accumulated in the capacitive element, a switch means for turning on and off a photoelectric charge transfer operation from the capacitive element to the capacitive element, a resetting switch means for resetting the capacitive element and the capacitive element, a pixel selecting switch means, and a source follower switch means. An effective saturation capacity of the capacitive element is 10 to 5,000 times an effective saturation capacity of the capacitive element.

1 Claim, 11 Drawing Sheets

(56) References Cited

U.S. PATENT DOCUMENTS

| | | | |
|---|---|---|---|
| 2008/0210993 A1* | 9/2008 | Oshikubo | H01L 27/14641 |
| | | | 348/E3.018 |
| 2008/0251691 A1* | 10/2008 | Adachi | H04N 5/3591 |
| | | | 250/206 |
| 2008/0266434 A1 | 10/2008 | Sugawa et al. | |
| 2008/0297637 A1* | 12/2008 | Gomi | H04N 5/3532 |
| | | | 348/E5.091 |
| 2009/0295973 A1 | 12/2009 | Oshikubo et al. | |
| 2017/0324916 A1 | 11/2017 | Sugawa et al. | |

FOREIGN PATENT DOCUMENTS

| | | | |
|---|---|---|---|
| JP | 2006060569 A * | 3/2006 | |
| JP | 2007-324984 A | 12/2007 | |
| JP | 2008-258885 A | 10/2008 | |
| JP | 2010-003995 A | 1/2010 | |
| JP | 2010-226679 A | 10/2010 | |
| WO | 2016/080337 A1 | 5/2016 | |

OTHER PUBLICATIONS

International Search Report, dated Jul. 17, 2018, in International Application No. PCT/JP2018/016450.
Notice of Reasons for Rejection, dated Nov. 1, 2018, issued in Japanese Counterpart Patent Application No. 2019-522024.

* cited by examiner

[fig.1]
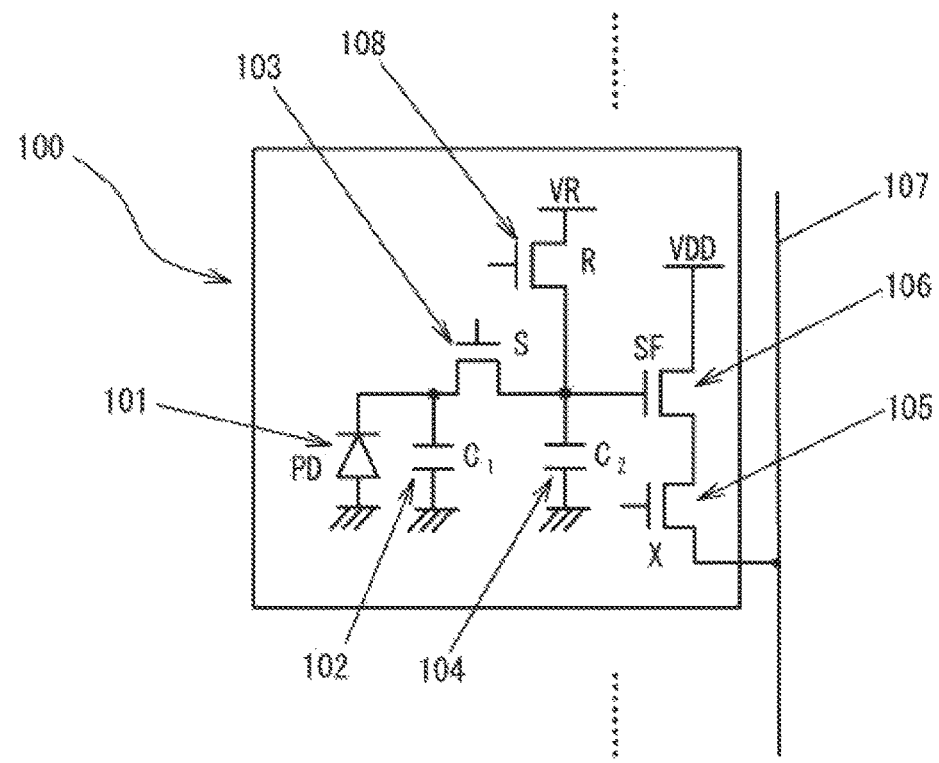
[fig.2A]
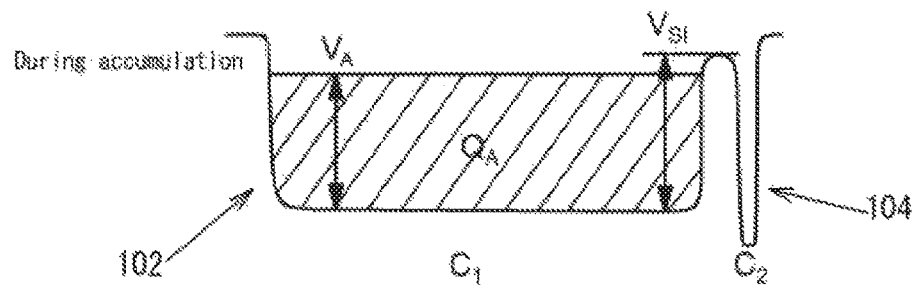

[fig.2B]
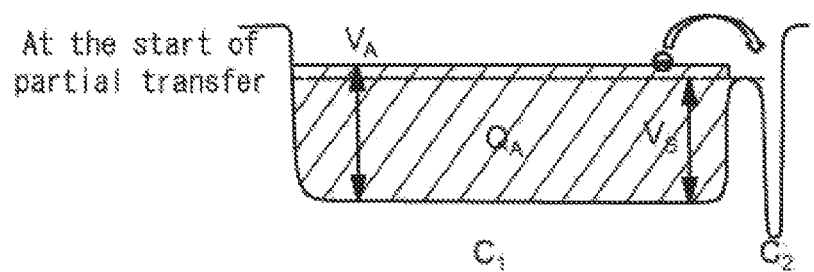
[fig.2C]
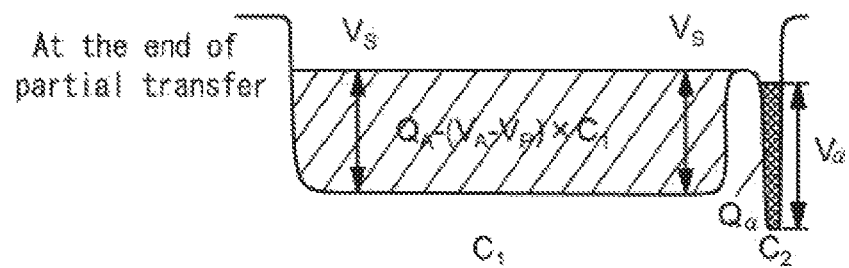

[fig.2D]
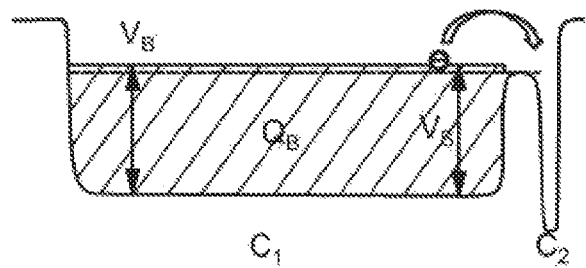
[fig.2E]
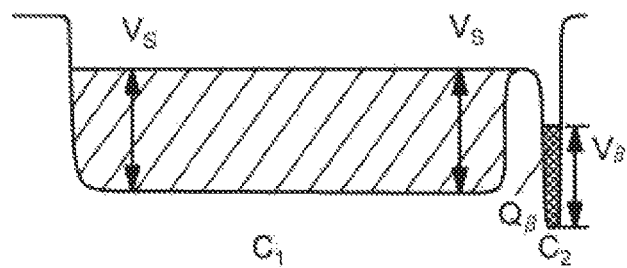

[fig3A]
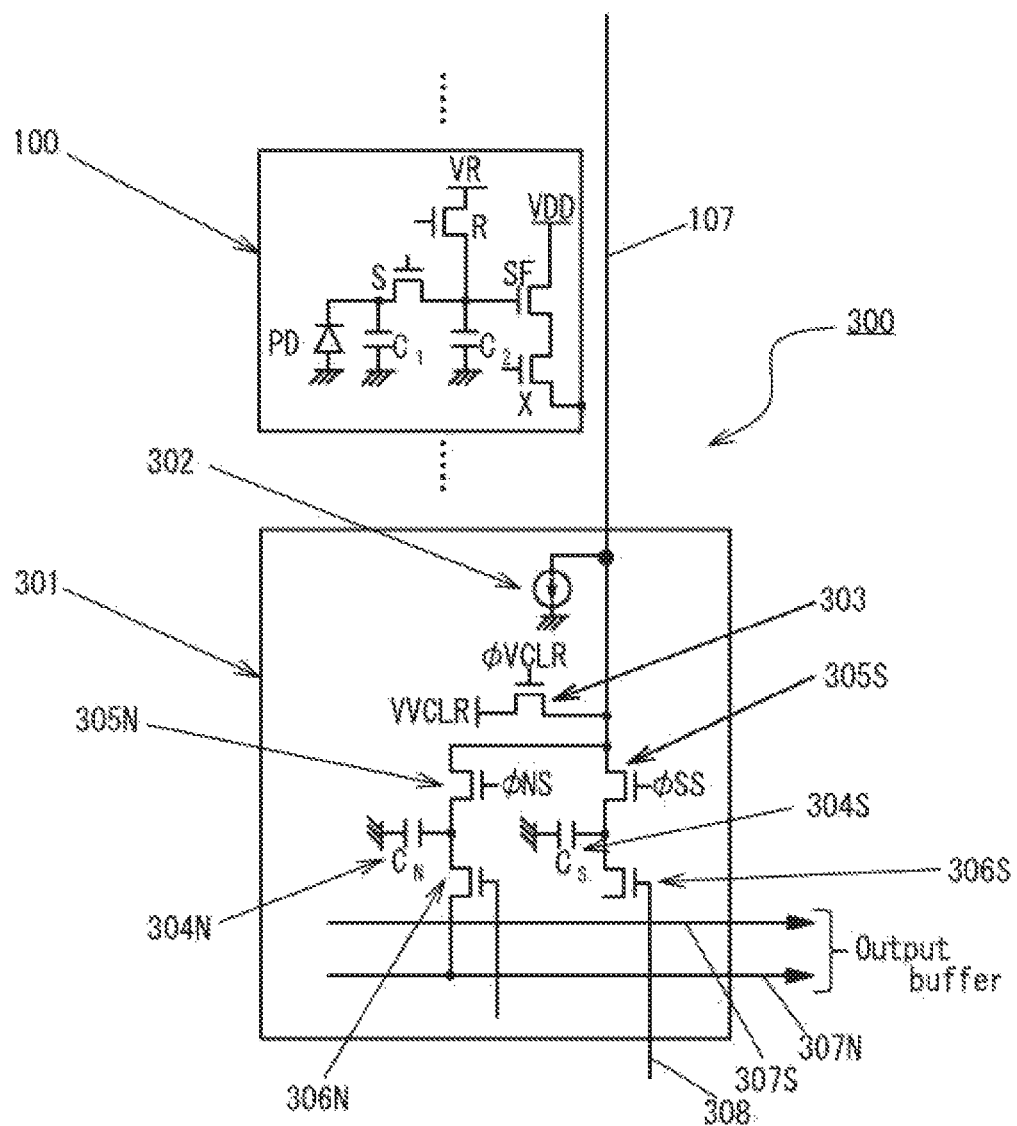

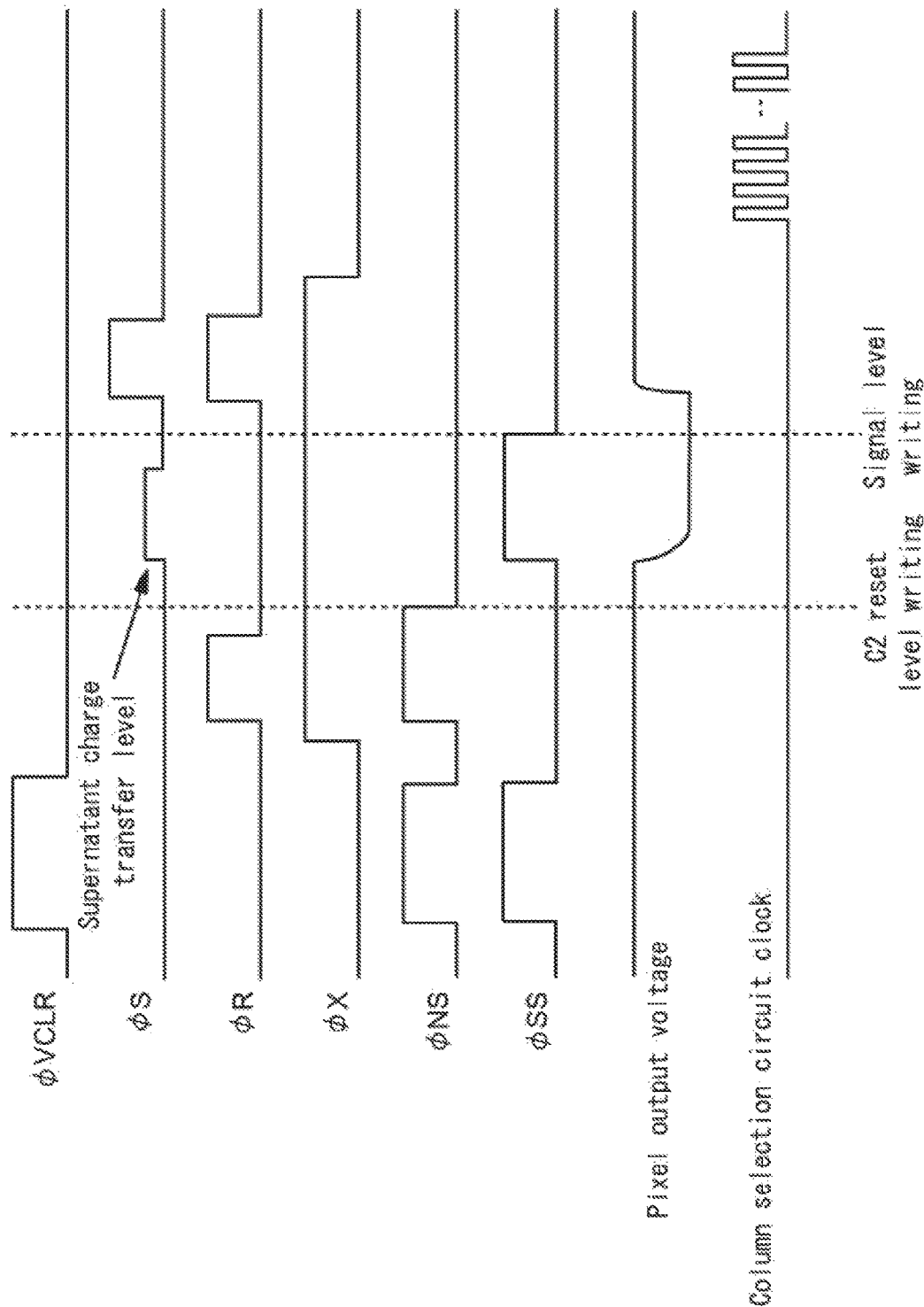

[fig.4A]
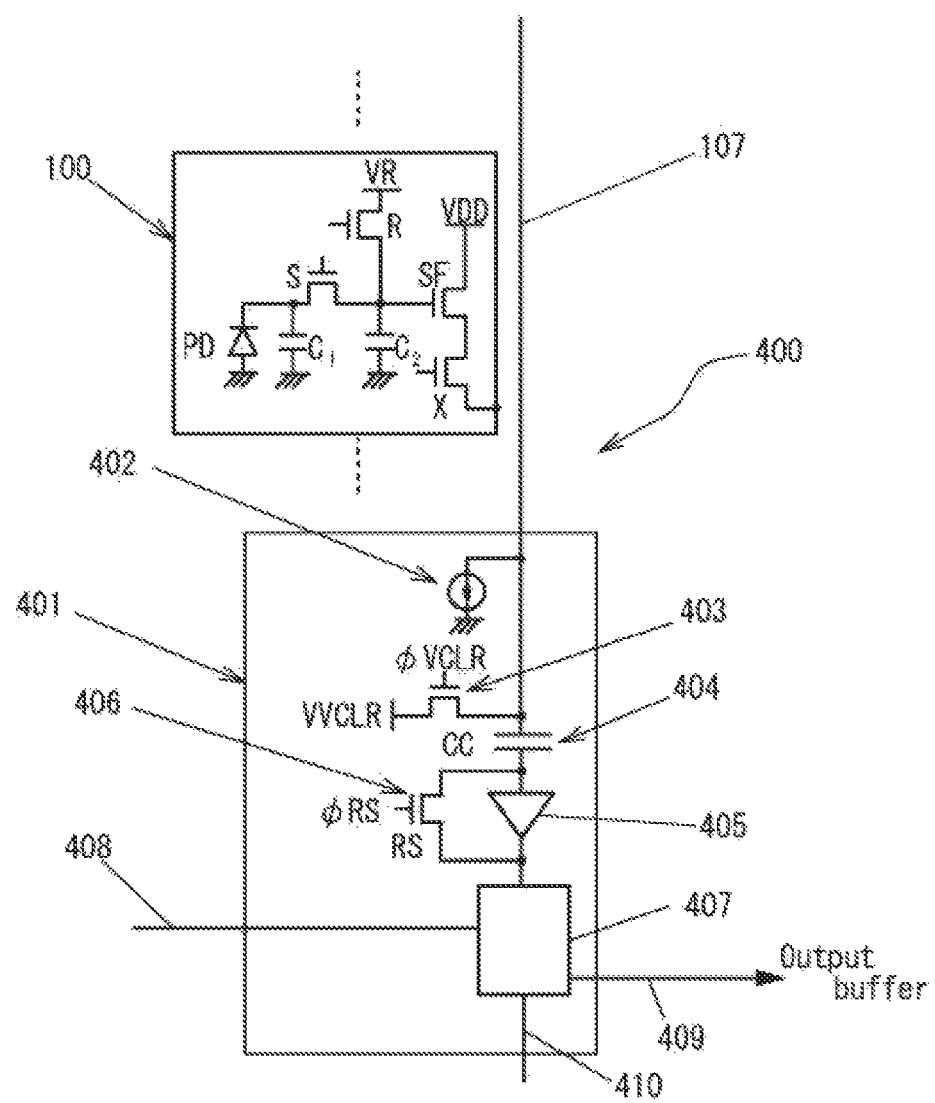

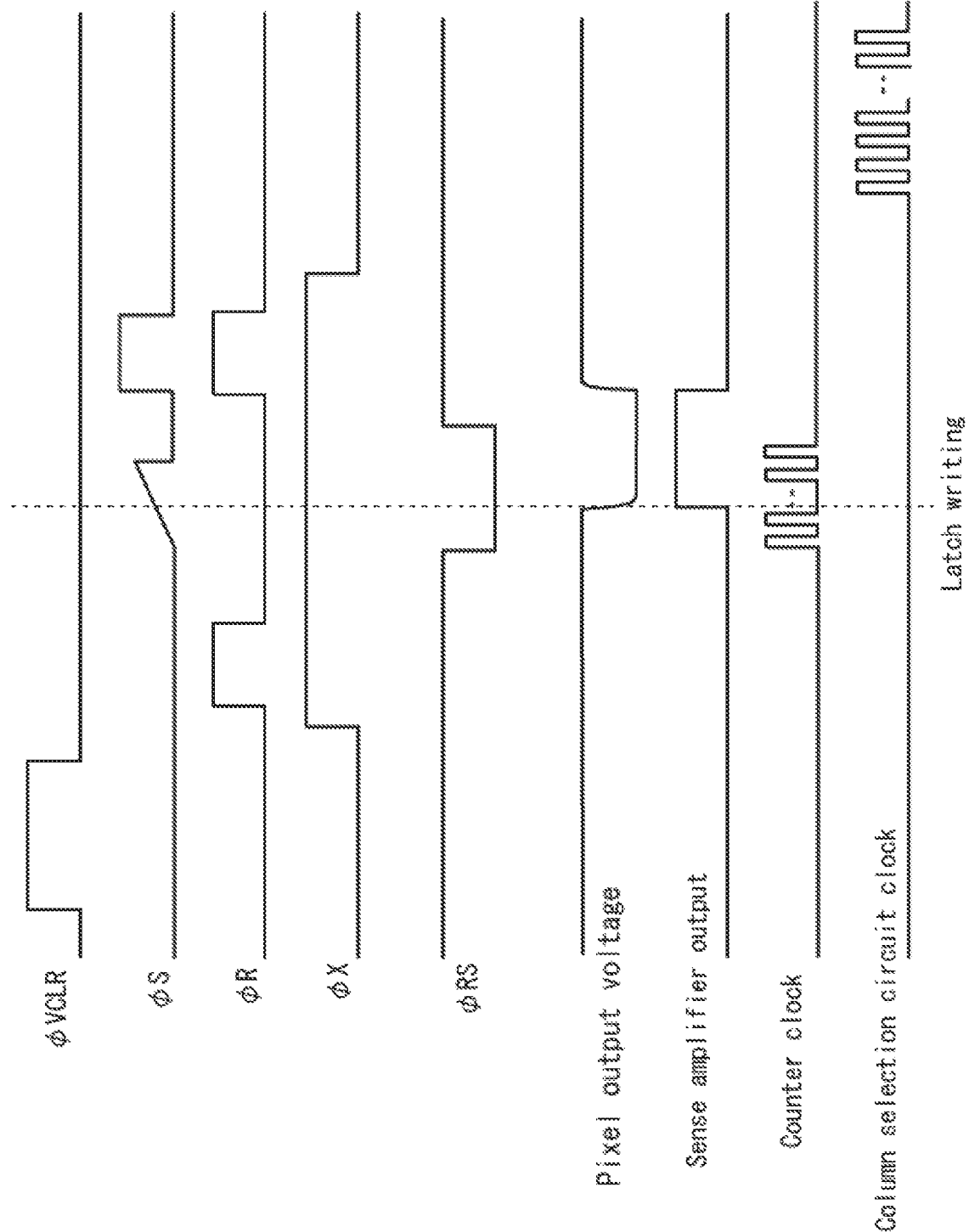

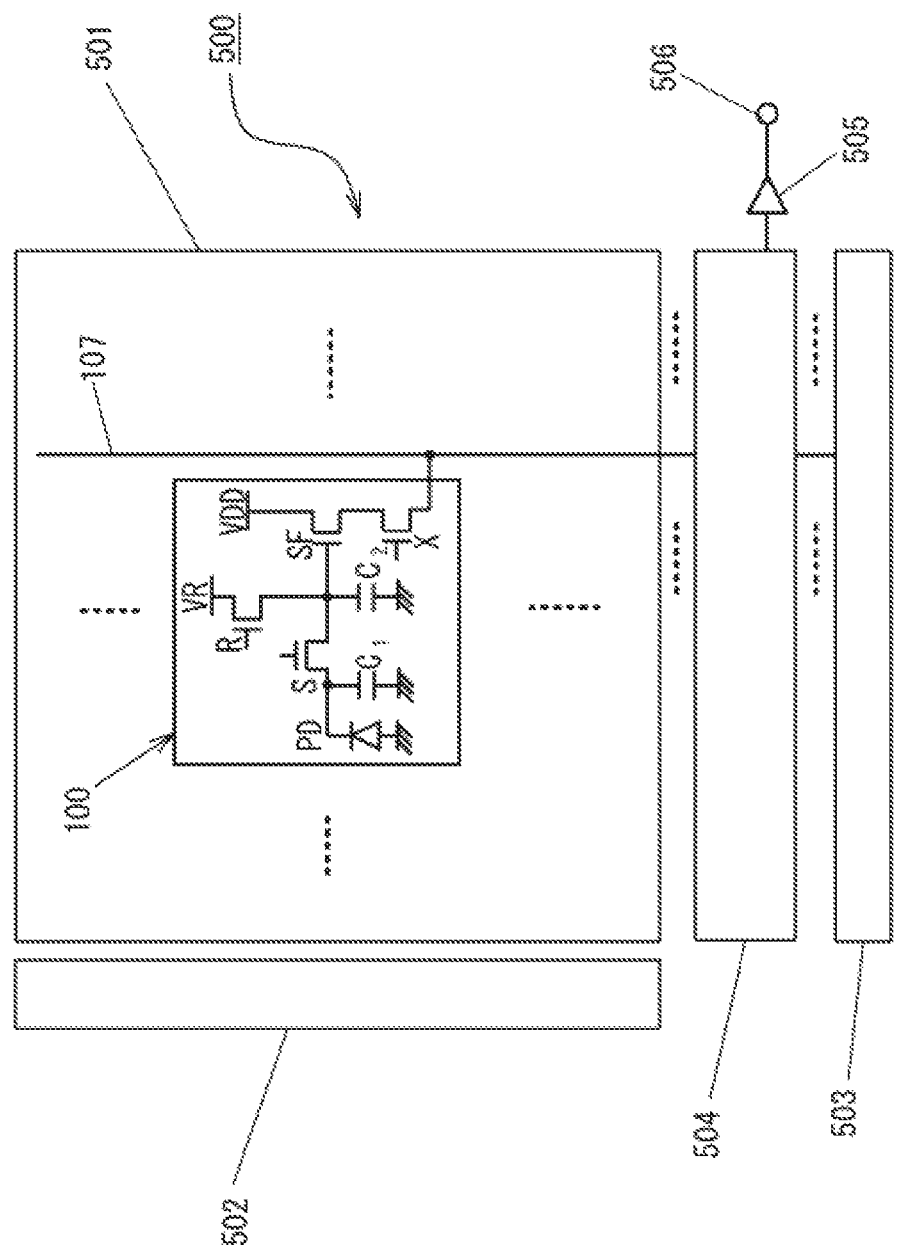

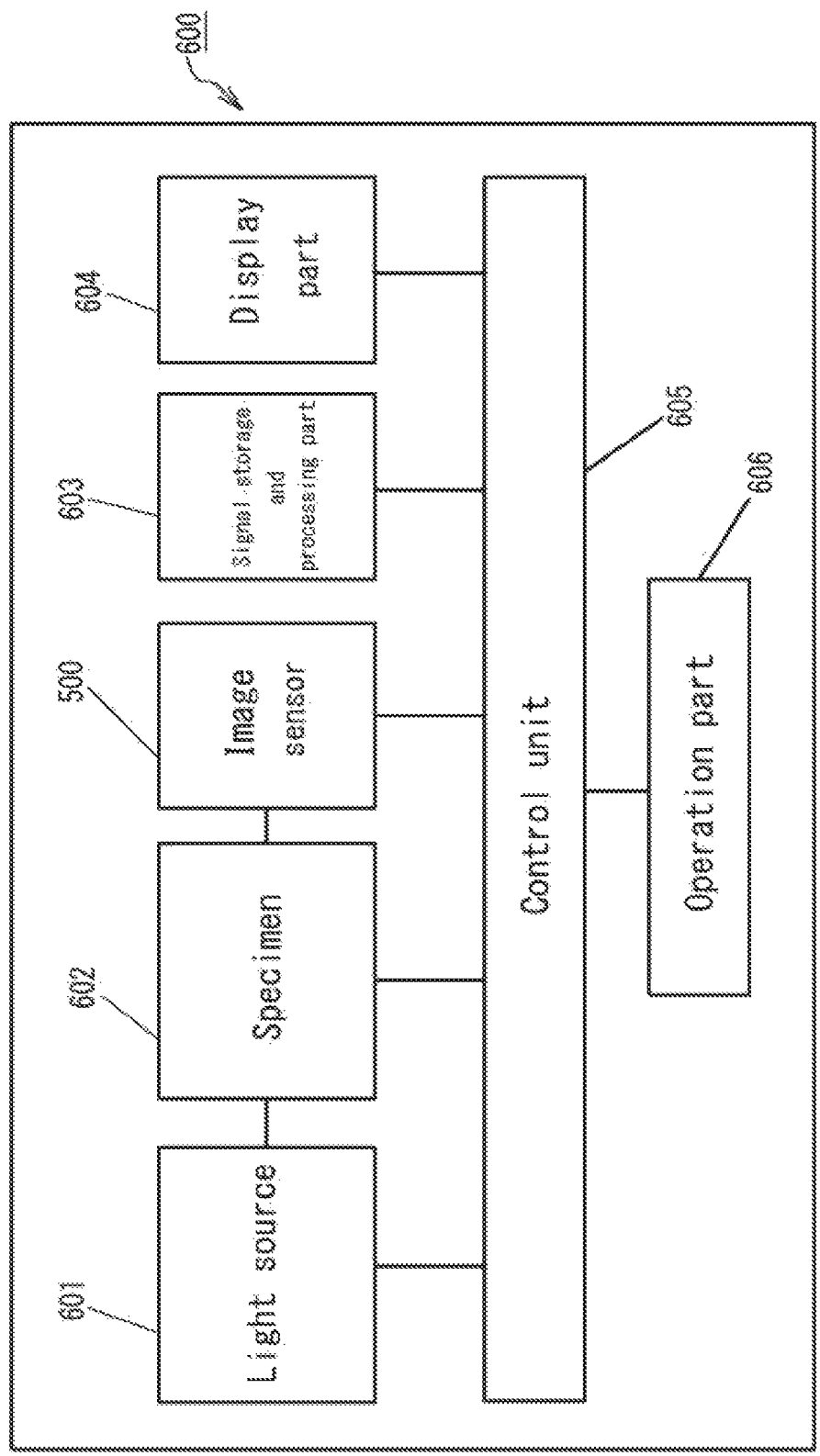

[fig.7]
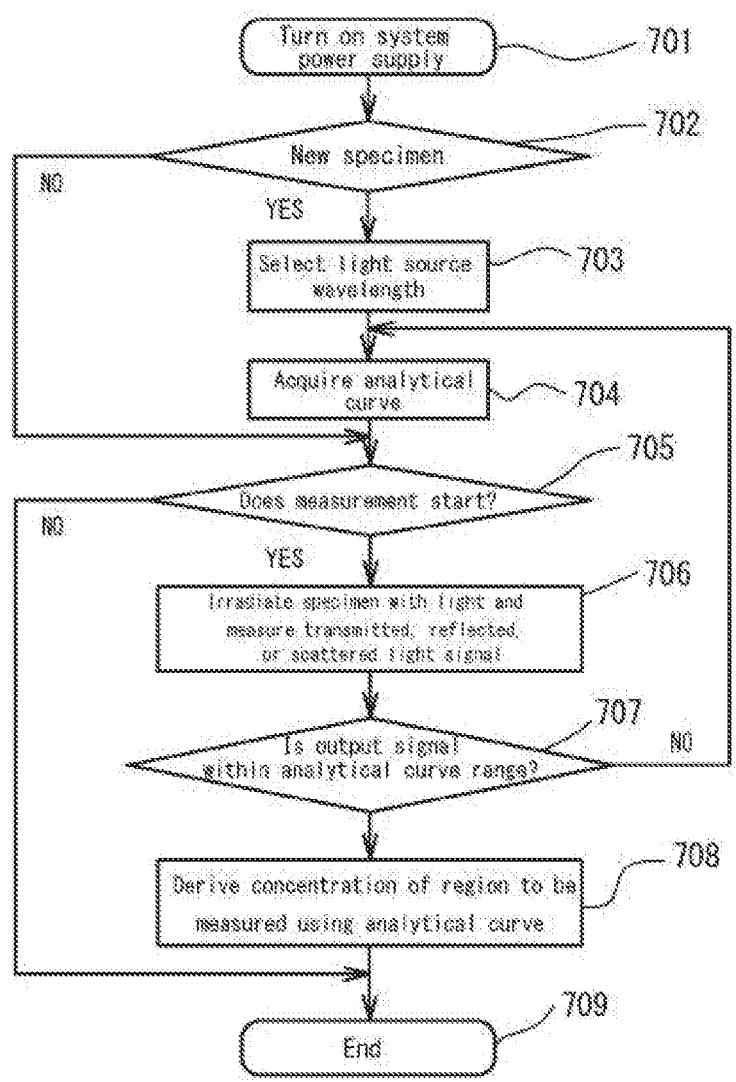

[fig.8]
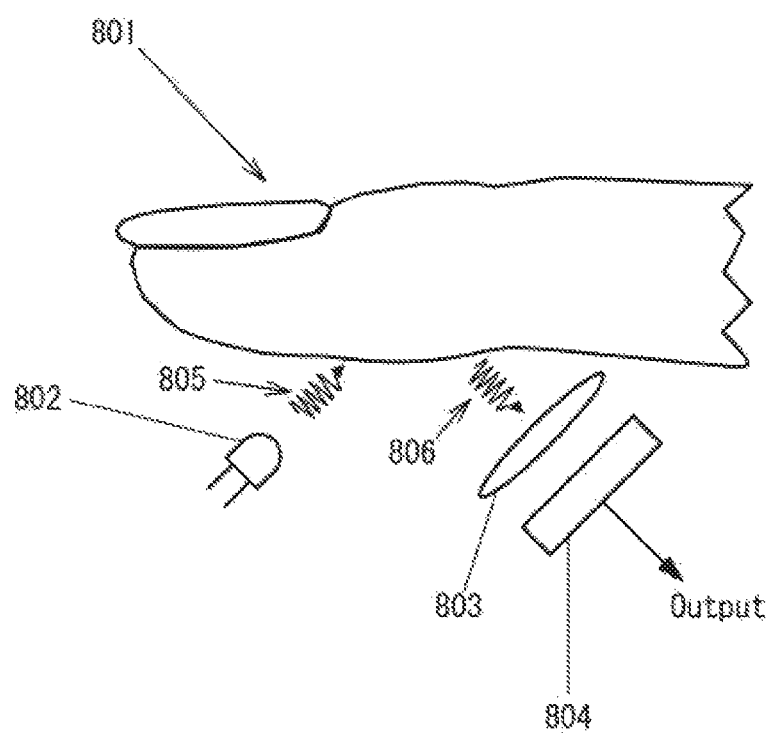

LIGHT-RECEIVING DEVICE AND METHOD FOR READING OUT SIGNAL OF LIGHT-RECEIVING DEVICE

FIELD OF THE INVENTION

The present invention relates to a light-receiving device and a method for reading out a signal of a light-receiving device.

DESCRIPTION OF THE BACKGROUND ART

Light-receiving (sensor) devices represented by image sensors are widely used in various fields, such as information equipment, medical care, crime prevention, in-vehicle, energy and environment, agriculture, infrastructure, space, and defense.

As information transmission by images has become the mainstream, light-receiving devices have been widely applied as optical input devices and photo detection devices, serving as components for not only devices related to general photography but also devices related to imaging, measurement, and analysis in various fields, such as life science, crime prevention, in-vehicle, energy and environment, medical, infrastructure, space, defense, agriculture, food, resource survey, and disaster prevention, and the importance thereof is rapidly increasing.

Among these, in fields such as weighing, measurement, and analysis, there is a need for a light-receiving device that can measure and weigh a very small change in light quantity with high sensitivity and high speed, and a method for reading out a signal thereof. Then, in order to further accelerate application expansion and business development, a light-receiving device that can measure and weigh an even smaller change in light quantity with higher sensitivity and higher speed, and a method for reading out a signal thereof are required.

In particular, light-receiving sensor technology that accurately measures very small optical signals and very small light quantity change signals is one of the technologies in high demand by the market, including a high degree of perfection thereof.

Among these, for example, a light-receiving sensor described in Patent Document 1 and the like has attracted attention. The light-receiving sensor described in Patent Document 1 is undoubtedly an excellent sensor with its high sensitivity, high speed processing, wide dynamic range, and wide optical band compatibility.

In order to accurately analyze an extremely small amount of a substance to be detected by absorption analysis, it is conceivable to increase the light quantity irradiated onto a specimen containing the extremely small amount of the substance to be detected. However, the conversion gain when the charge is converted to voltage must be increased to some extent and the saturation charge amount of the light-receiving sensor must also be increased.

PATENT DOCUMENTS

Patent Document 1: International Patent Publication WO2016/080337

SUMMARY OF THE INVENTION

Problems to be Solved by the Invention

Nevertheless, in a light-receiving sensor of the related art, the saturation charge amount is proportional to a capacity ($C_{FD}$) of floating diffusion (FD) for performing charge-voltage conversion in a light-receiving pixel, and the conversion gain is inversely proportional to the capacity ($C_{FD}$), resulting in a trade-off relationship between the saturation charge amount and the conversion gain. As a result, in the field of absorption analysis, which requires high analysis precision, it is not always possible to take advantage of superiority in high sensitivity, high-speed processing, wide dynamic range, and wide optical wavelength band compatibility.

The present invention has been earnestly made in light of the above-described points, and an object of the present invention is to provide a light-receiving device that achieves both high saturation performance and high sensitivity performance.

Another object of the present invention is to provide a method for reading out a signal of a light-receiving device that enables high precision analysis and high sensitivity analysis while maintaining superiority in high sensitivity, high speed processing, wide dynamic range, and wide optical wavelength band compatibility.

Yet another object of the present invention is to provide a method for reading out a signal of a light-receiving device capable of greatly contributing to fields such as absorption analysis, which requires high analysis precision.

Means for Solving the Problems

An aspect of the present invention is a light-receiving device comprising: a light-receiving pixel including a light-receiving element, a first capacitive element (1) that accumulates a photoelectric charge produced by light received by the light-receiving element, a second capacitive element (2) that accumulates a transferred portion of an amount of the photoelectric charge accumulated in the capacitive element (1), a switch means (S) for turning on and off a photoelectric charge transfer operation from the capacitive element (1) to the capacitive element (2), a resetting switch means (R) for resetting the capacitive element (1) and the capacitive element (2), a pixel selecting switch means (X), and a source follower switch means (SF). An effective saturation capacity (1) of the capacitive element (1) is 10 to 5,000 times an effective saturation capacity (2) of the capacitive element (2).

Another aspect of the present invention is a method for reading out a signal of a light-receiving device comprising a light-receiving pixel including a light-receiving element, a first capacitive element (1) that accumulates a photoelectric charge produced by light received by the light-receiving element, a second capacitive element (2) that accumulates a transferred portion of an amount of the photoelectric charge accumulated in the capacitive element (1), a switch means (S) for turning on and off a photoelectric charge transfer operation from the capacitive element (1) to the capacitive element (2), a resetting switch means (R) for resetting the capacitive element (1) and the capacitive element (2), a pixel selecting switch means (X), and a source follower switch means (SF), an effective saturation capacity (1) of the capacitive element (1) being 10 to 5,000 times an effective saturation capacity (2) of the capacitive element (2). The method for reading out a signal of the light-receiving device comprises the steps of, after resetting the light-receiving device as necessary, irradiating light having a light quantity capable of producing a photoelectric charge amount necessary and sufficient to fill the effective saturation capacity of the capacitive element (1) onto the light-receiving element to fill a capacity of the capacitive element (1) with a photoelectric charge produced in the light-receiving element up to the effective saturation capacity; turning on the switch means (X) to select the light-receiving pixel; transferring and accumulating from the capacitive element (1) into the capacitive element (2) a charge amount exceeding a potential barrier relative to the capacitive element (1) during transfer of a photoelectric charge from the capacitive element (1) to the capacitive element (2) by the switch means (S); and outputting from the light-receiving pixel a voltage signal corresponding to the charge amount accumulated in the capacitive element (2).

Effect of the Invention

According to the present invention, it is possible to provide a light-receiving device that achieves both high saturation performance and high sensitivity performance, and a method for reading out a signal of a light-receiving device that enables high precision analysis and high sensitivity analysis while maintaining superiority in high sensitivity, high speed processing, wide dynamic range, and wide optical wavelength band compatibility and, for example, greatly contribute to fields such as absorption analysis, which requires high analysis precision.

Other features and advantages of the present invention will be apparent from the following descriptions taken in conjunction with the accompanying drawings. It should be noted that, in the accompanying drawings, the same reference numerals denote the same or similar components.

BRIEF DESCRIPTION OF THE DRAWINGS

FIG. 1 is a circuit configuration explanatory view for explaining a pixel circuit part 100 of a light-receiving pixel arranged on a light-receiving surface of a light-receiving element according to the present invention.

FIG. 2A is a schematic explanatory view for explaining a signal read-out principle of a light-receiving element including the pixel circuit part 100 illustrated in FIG. 1.

FIG. 2B is a schematic explanatory view for explaining the signal read-out principle of a light-receiving element in continuation from FIG. 2A.

FIG. 2C is a schematic explanatory view for explaining the signal read-out principle of a light-receiving element in continuation from FIG. 2B.

FIG. 2D is a schematic explanatory view for explaining the signal read-out principle of a light-receiving element in continuation from FIG. 2C.

FIG. 2E is a schematic explanatory view for explaining the signal read-out principle of a light-receiving element in continuation from FIG. 2D.

FIG. 3A is a drawing for explaining one of the preferred embodiments, and is a timing chart for explaining a configuration thereof.

FIG. 3B is a drawing for explaining one of the preferred embodiments, and is a timing chart for explaining an operation thereof.

FIG. 4A is a timing chart for explaining a configuration of another example of a preferred embodiment.

FIG. 4B is a timing chart for explaining an operation for explaining another example of a preferred embodiment.

FIG. 5 is a drawing illustrating a preferred example of a main portion of an overall configuration of an image sensor according to the present invention.

FIG. 6 is a block diagram for explaining a configuration of an absorption analysis system 600 including an image sensor 500.

FIG. 7 is a flowchart of an example of an analysis procedure when analyzing a concentration body of a substance to be detected using the absorption analysis system 600.

FIG. 8 is a schematic outline explanatory view when a blood glucose level in blood of a human body is measured using a scattered light imaging type absorption analysis system according to the present invention.

DESCRIPTION OF THE PREFERRED EMBODIMENTS

A pixel circuit part 100 illustrated in FIG. 1 is configured by a so-called pixel source follower circuit. That is, the pixel circuit part 100 is configured by an electronic element group of one light-receiving element PD, such as a photodiode, four electronic switch means (S, R, SF, X), such as transistors, and two capacitive elements ($C_1$, $C_2$), forming the illustrated electronic circuit.

Photoelectric charges produced in a light-receiving element (PD) 101 by light reception are temporarily accumulated in a capacitive element ($C_1$) 102. A portion or all of the photoelectric charges accumulated in the capacitive element ($C_1$) 102 are transferred to a capacitive element ($C_2$) 104 when a charge transferring switch means (S) 103 is turned on stepwisely or asymptotically. The capacitive element ($C_2$) 104 is utilized to perform charge-voltage conversion.

In FIG. 1, "VR" refers to reset voltage, and "VDD" refers to power supply voltage.

When a pixel selecting switch means (X) 105 is turned on, a voltage signal having a magnitude equivalent to a charge amount transferred to the capacitive element ($C_2$) 104 via a source follower switch means (SF) 106 is output to a pixel column output signal line 107.

Next, the principles of a method for reading out a signal in the present invention will be described with reference to FIGS. 2A to 2C. Hereinafter, one of the representative examples suitable for explaining one of the features of the present invention, that is, an example of a case of an absorption analysis for detecting an extremely small amount of a substance will be described.

FIG. 2A is a potential drawing schematically illustrated to explain a state in which a photoelectric charge produced in the light-receiving element (PD) 101 by light reception is accumulated in the capacitive element ($C_1$) 102, FIG. 2B is a potential drawing for schematically explaining a state in which a portion of a charge amount of the photoelectric charge is to be transferred to the capacitive element ($C_2$) 104 from a state in which a sufficient amount of photoelectric charge has accumulated as illustrated in FIG. 2A, and FIG. 2C is a potential drawing for schematically explaining a state after the portion of the charge amount of the photoelectric charge is transferred to the capacitive element ($C_2$) 104.

In this example, in order to detect an extremely small amount of a substance to be detected, a large quantity of light is irradiated onto a predetermined position of a specimen cell. The light irradiated onto the specimen cell may become any of a transmitted light that passes through the specimen cell, a reflected light that is reflected in the specimen cell, and a scattered light that is scattered in the specimen cell, and is received by a light-receiving element (or a light-receiving device).

In the present invention, a saturation capacity of a charge accumulation of the capacitive element ($C_1$) 102 is set to a sufficient capacity to prevent overflow even when a large quantity of light is received. Effectively, based on a design philosophy for obtaining a high light-receiving sensitivity and a detection accuracy capable of reliably detecting an extremely small amount of the substance to be detected, the quantity of light irradiated onto the substance to be detected, the saturation capacity of the charge accumulation of the capacitive element ($C_1$) 102, and the light-receiving sensitivity and SN ratio of the light-receiving element (or light-receiving device, hereinafter also referred to as "light-receiving element," including "light-receiving device") are appropriately selected and adopted.

Compared with the charge accumulation capacity of the capacitive element ($C_1$) 102, the saturation capacity of the charge accumulation of the capacitive element ($C_2$) 104 is preferably set to the minimum necessary saturation capacity in accordance with a design philosophy that allows absorption analysis at the target analysis performance. That is, in order to increase the conversion gain when converting the charge amount to voltage, the saturation capacity of the charge accumulation of the capacitive element ($C_2$) 104 is preferably decreased to the extent possible.

In the present invention, the quantity of light irradiated from the light source used to detect the substance to be detected is the quantity of light whereby the amount of photoelectric charge generated when the light-receiving element receives the irradiated light quantity is accumulated to be equal to the saturation capacity of the capacitive element ($C_1$) 102, or a capacity that is smaller than the saturation capacity but that can be substantially approximated as the saturation capacity within the range suitable for the object of the present invention (hereinafter also referred to as "substantial saturation capacity").

It should be noted that, in the present invention, hereinafter, the term "saturation capacity" includes the meaning of "substantial saturation capacity" described above in addition to the original technical meaning, unless otherwise specified.

Further, hereinafter, the term "saturation irradiation light quantity" is used as the irradiation light quantity required for producing the photoelectric charge amount sufficient for filling the saturation capacity or the substantial saturation capacity.

Furthermore, the quantity of light irradiated from the light source may be considered as an irradiation light quantity (hereinafter also referred to as "unsaturation irradiation light quantity") sufficient for producing a photoelectric charge having an amount that satisfies the capacity (hereinafter referred to as "unsaturation capacity") within a range in which the photoelectric charge amount generated in blank irradiation (irradiation without a substance to be detected) is less than the saturation capacity, in accordance with a degree of detection accuracy that achieves the intended purpose. In particular, when the physical dimensions of the light-receiving element are sufficiently large and the saturation capacity of the capacitive element ($C_1$) 102 is sufficiently large, it is also possible to set the unsaturation irradiation light quantity to a light source irradiated light quantity somewhat smaller than the saturation irradiation light quantity.

For example, as the unsaturation irradiation light quantity in this case, the photoelectric charge amount generated in blank irradiation is preferably a 15% decrease, more preferably a 10% decrease, and even more preferably a 5% decrease from the saturation capacity. Nevertheless, from the viewpoint of making the light-receiving element more compact, it is preferable to select an irradiation light quantity equal to the saturation irradiation light quantity, as much as possible.

In the present invention, hereinafter, the capacity equivalent to the photoelectric charge amount produced by the unsaturation irradiation light quantity accumulated in the capacitive element is referred to as "unsaturation capacity."

It should be noted that, in the present invention, hereinafter, the technical meaning of "saturation irradiation light quantity" as well as the technical meaning of the substantial saturation irradiation light quantity and the technical meaning of the unsaturation irradiation light quantity are referred to as "effective saturation irradiation light quantity."

Further, in the present invention, hereinafter, the technical meaning of "saturation capacity" as well as the technical meanings of the "substantial saturation capacity" and the "unsaturation capacity" are referred to as "effective saturation capacity."

The charge accumulation state illustrated in FIG. 2A indicates that a photoelectric charge amount slightly smaller than the saturation capacity is accumulated in the capacitive element ($C_1$) 102. The voltage brought by this accumulated charge amount is indicated by $V_A$. Incidentally, the voltage at the saturation capacity of the capacitive element ($C_1$) 102 is indicated as $V_{SI}$ (equivalent to a saturation potential barrier voltage of the "switch means (S) 103").

The charge accumulation state illustrated in FIG. 2B indicates a state in which a charge amount equivalent to a supernatant amount (hereinafter also referred to as "transfer charge amount") of the accumulated charge amount is to be transferred from the charge accumulation state illustrated in FIG. 2A to the capacitive element ($C_2$) 104. The transfer of the charge from the capacitive element ($C_1$) 102 to the capacitive element ($C_2$) 104 is performed by increasing a gate voltage of the switch means (S) 103 and setting the potential barrier voltage relative to the capacitive element ($C_1$) of the switch means (S) 103 to a voltage $V_S$ lower than the voltage $V_A$. The transfer charge amount is the charge amount corresponding to a potential difference ($V_A$-$V_S$).

The smaller the charge amount transferred to the capacitive element ($C_2$) 104, the larger the conversion gain, in accordance with the light-receiving sensitivity and SN ratio of the light-receiving element.

In the present invention, the light quantity of the blank irradiation (irradiation when there is no substance to be detected) is increased by increasing the saturation capacity of the charge accumulation of the capacitive element ($C_1$) 102 (hereinafter also referred to as "saturation capacity (1)"), and the detection accuracy is increased by increasing the quantity of irradiated light absorbed by the substance to be detected, even if extremely small.

Furthermore, when the saturation capacity (1) is large, the substance to be detected can be irradiated with light having high illuminance to increase the quantity of light absorbed by the substance to be detected and, as a result, a high sensitivity absorption analysis can be performed.

As described above, even when the effective irradiation light quantity is set in advance as the light quantity corresponding to the saturation charge accumulation amount of the capacitive element ($C_1$) 102, before starting the absorption analysis, it is preferable to irradiate a blank sample (a sample not containing the substance to be detected) with light in the effective irradiation light quantity to confirm the saturation charge accumulation amount of the capacitive element ($C_1$) 102 since this makes it possible to measure the substance to be detected more accurately and reliably.

FIG. 2C illustrates a state immediately after transitioning from the state illustrated in FIG. 2B by increasing the gate voltage of the switch means 103 and reducing the potential barrier voltage relative to the capacitive element ($C_1$) 102 of the switch means 103 from $V_{SI}$ to $V_S$.

When the gate voltage of the switch means 103 is set to be the potential barrier voltage $V_S$ relative to the capacitive element ($C_1$) 102 of the switch means 103, the supernatant charge amount (charge amount $Q_\alpha$) within the charge amount $Q_A$ accumulated in the capacitive element ($C_1$) 102 is transferred to and accumulated in the capacitive element ($C_2$) 104. The charge amount $Q_\alpha$ transferred to the capacitive element ($C_2$) 104 produces a voltage $V_\alpha$, from the following equation (1).

$$V_\alpha = (V_A - V_S) \times C_1/C_2 \qquad (1)$$

FIG. 2D illustrates, in a case where the substance to be detected is irradiated to detect the substance to be detected, the state immediately before the photoelectric charge amount produced by the irradiated light quantity reduced by an amount equivalent to the quantity of light absorbed by the substance to be detected is accumulated in the capacitive element ($C_2$) 102, and subsequently the gate voltage of the switch means 103 is set so that the potential barrier voltage relative to the capacitive element ($C_1$) 102 of the switch means 103 changes from $V_{SI}$ to $V_S$, thereby transferring the supernatant charge amount (charge amount $Q_\beta$) corresponding to the potential difference ($V_B$-$V_S$) to the capacitive element ($C_2$) 104 (corresponding to FIG. 2B). The charge amount $Q_\beta$ transferred to the capacitive element ($C_2$) 104 produces a voltage $V_\beta$ from the following equation (2).

$$V_\beta = (V_B - V_S) \times C_1/C_2 \qquad (2)$$

FIG. 2E corresponds to FIG. 2C. That is, FIG. 2E illustrates a state immediately after transitioning from the state illustrated in FIG. 2B by changing the gate voltage of the switch means 103 to reduce the potential barrier voltage relative to the capacitive element ($C_1$) 102 of the switch means 103 from $V_{SI}$ to $V_S$. The detected amount of the substance to be detected can be detected by subtracting equation (2) from equation (1).

While the explanation example described above describes in detail a case where the effective irradiation light quantity of the light source is set in advance, even when the irradiation light quantity of the light source is not set in advance, the detected amount of the substance to be detected can be detected as described below as long as the irradiated light quantity is less than the effective irradiation light quantity.

First, in a state in which the voltage $V_{SI}$ is applied to the gate of the switch means 102, the blank sample (sample not containing the substance to be detected) is irradiated with light from the light source, and the photoelectric charge amount is accumulated in the capacitive element ($C_1$) 102.

Subsequently, the gate voltage of the switch means 102 is decreased gradually or stepwisely to find a gate voltage (V1) immediately before the charge accumulated in the capacitive element ($C_1$) 102 starts to be transferred to the capacitive element ($C_2$) 104.

Next, a voltage (V2) lower than V1 is applied to the gate of the switch means 102, and a supernatant charge amount (Q1) within the photoelectric charge amount accumulated in the capacitive element ($C_1$) 102 is transferred to the capacitive element ($C_2$) 104. The supernatant charge amount (Q1) at this time, while preferably as small as possible from the viewpoint of further increasing the conversion gain in order to increase the signal detection accuracy, is preferably as large as possible from the viewpoint of expanding the detection concentration range of the substance to be detected. Since the conversion gain and the detection range of the substance to be detected are in a trade-off relationship, the optimum value of the supernatant charge amount (Q1) is appropriately determined in accordance with the expected amount of detection of the substance to be detected.

The subsequent detection method and detection procedure of the substance to be detected are the same as those in the case described above in which the irradiation quantity of the light source is set in advance.

Next, a preferred embodiment according to the present invention will be described with reference to FIGS. 3A to 5. The meanings of symbols denoted using English and Greek letters in FIGS. 2A to 5 are as follows:

PD Light-receiving element such as a photodiode
$C_1$ Capacitive element (that performs photoelectric charge accumulation)
$C_2$ Capacitive element (that performs charge-voltage conversion)
VR Reset voltage
VDD Power supply voltage
S Switch means
R Reset means
SF Source follower switch means
X Pixel selection means
$V_{SI}$ Saturation potential barrier relative to $C_1$ of switch means (S) during accumulation period
$V_S$ Potential barrier relative to $C_1$ of switch means (S) during transfer of supernatant charges
$Q_A$ Photoelectric charge amount accumulated in $C_1$ in blank irradiation
$V_A$ Voltage produced by $C_1$ in blank irradiation
$Q_\alpha$ Transfer charge amount in blank irradiation
$V_\alpha$ Signal voltage produced by $C_2$ by transfer charge in blank irradiation
$Q_B$ Photoelectric charge amount accumulated in $C_1$ in light irradiation with absorption by the specimen substance
$V_B$ Voltage produced by $C_1$ in light irradiation with absorption by the specimen substance
$Q_\beta$ Transfer charge amount in light irradiation with absorption by the specimen substance
$V_\beta$ Signal voltage produced by $C_2$ by transfer charge in light irradiation with absorption by the specimen substance
VVCLR Pixel output line reset voltage
$C_N$ C2 reset level sample holding capacity
$C_S$ Optical signal level sample holding capacity
CC Coupling capacity
RS Sense amplifier reset means
φVCLR Pixel output line reset pulse
φS Switch means driving signal
φR Reset means driving pulse
φX Pixel selecting pulse
φNS C2 reset level sampling pulse
φSS Optical signal level sampling pulse
φRS Sense amplifier reset pulse FIGS. 3A and 3B are drawings for explaining one of the preferred embodiments, FIG. 3A being a diagram for explaining the configuration thereof and FIG. 3B being a timing chart for explaining the operation thereof.

In FIG. 3A, a sensor main part 300 of the image sensor according to the present invention includes one of a plurality of the light-receiving pixels 100 arranged two-dimensionally, the pixel column output signal line 107, and a column-parallel circuit 301.

Components that are the same as the numbered components illustrated in FIG. 1 use the same numbering as the numbering indicated in FIG. 1. This point is the same in subsequent drawings as well.

A preferred example of the main portion of the overall configuration of the image sensor including the sensor main part 300 is denoted as 500 in FIG. 5. An image sensor 500 includes a pixel array 501 in which the light-receiving pixels 100 are arranged in a two-dimensional matrix in n rows and m columns, a row selection circuit 502, a column selection circuit 503, a column-parallel circuit 504, an output buffer 505, and a signal output terminal 506.

The column-parallel circuit 301 includes a current source 302 for driving a source follower circuit, a pixel output line reset means 303, two sample holding capacitive elements ($C_N$) 304N, ($C_S$) 304S, two write selecting switch means 305S, 305N for writing signals (accumulating charges) to each of the two sample holding capacitive elements ($C_N$) 304N, ($C_S$) 304S, two read-out selecting switch means 305S, 305N for reading out signals from each of the two sample holding capacitive elements ($C_N$) 304N, ($C_S$) 304S (transferring accumulated charges to the output side downstream), two output lines 306S, 306N, and a column selection circuit output line 307.

The column-parallel circuit 301 may be provided with an amplifier or an analog-to-digital (AD) converter.

Next, the signal read-out operation of the image sensor will be described with reference to FIGS. 3A, 3B, and 5. FIG. 3B is a drawing showing a timing chart of signal read-out of the image sensor in FIG. 3A.

FIG. 5 is a drawing illustrating a preferred example of a main portion of an overall configuration of the image sensor according to the present invention. The image sensor 500 illustrated in FIG. 5 includes the pixel array 501, the row selection circuit 502, the column selection circuit 503, the column-parallel circuit array 504, the output buffer 505, and the signal output terminal 506. An outline of the timing of the signal read-out can be described as follows. First, signals from the pixels 100 are read out in column-parallel manner for each row to the pixel output line 107, and temporarily stored in a sample holding capacity 305 in the column-parallel circuit 301. Subsequently, the temporarily held signals are read out sequentially per column.

The read-out procedure is as follows.

(1-1) A row of a read-out target is selected by the row selection circuit 502.

(1-2) Reset operation of the pixel output line 107, the sample holding capacitive element ($C_N$) 304N, and the sample holding capacitive element ($C_S$) 304S: Corresponding means for applying φVCLR, φNS, and φSS are turned on to reset the pixel output line 107, the sample holding capacitive element ($C_N$) 304N, and the sample holding capacitive element ($C_S$) 304S.

(1-3) Reading out the reset level of capacitive element ($C_2$) 104: The pixel selecting switch means (X) 105 and the write means 305N are turned on to apply the signal φX and the signal NS to the corresponding means, and couple the output of the pixel (SF) 100, the pixel output line 107, and the capacitive element ($C_N$) 304N. Subsequently, a resetting switch means 108 is turned on to apply the signal pulse φR and reset the potential of the capacitive element ($C_2$) 104 to VR. Subsequently, the switch means 108 is turned off to make the potential of the capacitive element ($C_2$) 104 floating. At this time, while thermal noise is introduced into the potential of the capacitive element ($C_2$) 104, in the present invention, this thermal noise can be removed by the following method. By the operation of the pixel source follower circuit, a signal corresponding to the potential of $C_2$ is read out to the pixel output line 107 and the capacitive element ($C_N$) 304N. This becomes the sampling of the reset level in correlated double sampling. Subsequently, the write means ($C_N$) 304N is turned off, thereby temporarily saving the signal of the reset level of the capacitive element ($C_2$) 104 in the capacitive element ($C_N$) 305N.

(1-4) The write means 305S is turned on to apply the signal pulse φSS and set the signal pulse φS applied to the switch means 103 to the supernatant charge transfer level. Here, within the photoelectric charges accumulated in the light-receiving element (PD) 101 and the capacitive element 102 ($C_1$), a charge amount exceeding the potential barrier ($V_S$) relative to the capacitive element ($C_1$) 102 of the switch means (S) 103 during the supernatant charge transfer is transferred to the capacitive element ($C_2$) 104. The switch means (S) 103 is turned off to complete the supernatant charge transfer.

A voltage corresponding to the charge amount transferred to the capacitive element ($C_2$) 104 is read out to the pixel output line 107 and the capacitive element ($C_S$) 304S. Subsequently, the write means 305S is turned off, thereby temporarily storing a signal of a level corresponding to the optical signal level (quantity of light received by the light-receiving element 101) in the capacitive element ($C_S$) 304S. This becomes the sampling of the optical signal level in correlated double sampling.

(1-5) The switch means (S) 103 and the switch means (R) 108 are turned on to reset the light-receiving element (PD) 101, the capacitive element ($C_1$) 102, and the capacitive element ($C_2$) 104. Subsequently, the switch means (S) 103 and the switch means (R) 108 are turned off to enter the next accumulation operation. The switch means (X) 105 is turned off to electrically disconnect the pixel 100 and the pixel output line 107.

(1-6) The signals temporarily stored in the capacitive element ($C_N$) 304N and the capacitive element ($C_S$) 304S in the column-parallel circuit 301 are sequentially selected and read out to the outside of the image sensor main part 300 via an output buffer. In this example, the read-out signal is AD-converted by a circuit outside the image sensor main part 300. The signal of the capacitive element ($C_N$) 304N is subtracted from the signal of the capacitive element ($C_S$) 304S, making it possible to remove the thermal noise introduced when the capacitive element ($C_2$) 104 is reset and a threshold value variance of the switch means (SF) 106, and read out the optical signal with high accuracy.

(1-7) The next row of the read-out target is selected by the row selection circuit.

The signal read-out of one frame of the image sensor is completed by repeating the operations (1-1) to (1-7) for a predetermined number of rows as described above.

In the signal read-out operation of the image sensor described above with reference to FIGS. 3A, 3B, and 5, even when the saturation capacity of the capacitive element ($C_2$) 104 is decreased, the optical signal based on the photoelectric charge amount accumulated in the capacitive element ($C_2$) 104 can be read out with high accuracy by correlated double sampling.

FIGS. 4A and 4B are drawings for explaining another example of the preferred embodiments, FIG. 4A being a diagram for explaining the configuration thereof and FIG. 4B being a timing chart for explaining the operation thereof.

A sensor main part 400 of the image sensor according to the present invention includes one of a plurality of the light-receiving pixels 100 arranged two-dimensionally, a pixel column output signal line 107, and a column-parallel circuit 401. A preferred example of the main portion of the overall configuration of the image sensor including the sensor main part 400 is denoted as 500 in FIG. 5, similar to the sensor main part 300.

Next, the read-out operation will be described with reference to FIGS. 4A, 4B, and 5 in the same manner as with FIGS. 3A, 3B, and 5. The sensor main part 400 illustrated in FIG. 4A includes the plurality of pixels 100, the pixel output line 107, and the column-parallel circuit 401. The column-parallel circuit 401 includes a current source 402 for driving a source follower circuit, a pixel output line reset means 403, a coupling capacitive element (CC) 404, a sense amplifier 405, a switch (reset) means (RS) 406 for resetting the sense amplifier, a latch 407, a counter signal line 408, an output buffer line 409, and a column selection circuit output line 410. The column-parallel circuit 401 has a configuration for AD-converting pixel signals in column-parallel manner using a simple circuit configuration.

According to the circuit configuration illustrated in FIG. 4A, a slope type voltage synchronized with a counter signal is applied to the charge transferring switch means 103, and the time at which the voltage drop amount of the pixel column output signal line 107, caused by the photoelectric charges from the light-receiving element (PD) 101 to the capacitive element ($C_1$) 102 being slightly transferred, exceeds a predetermined value is recorded as a digital value.

This is a method in which a signal equivalent to a reference slope signal in a general single-slope type A/D converter is directly applied to the circuit part of the light-receiving pixel. Compared to a method in the related art of comparing the voltage values of the pixel column output signal line used in a complementary metal oxide semiconductor (CMOS) light-receiving sensor including a single-slope type A/D converter in which columns are set in parallel with the slope signal serving as a reference value, the circuit scale can be reduced and higher speed can be achieved.

FIG. 4B is a drawing showing a timing chart of signal read-out when the column-parallel circuit 401 illustrated in FIG. 4A is assembled. The signal read-out of the image sensor illustrated in FIG. 4A is performed using the following procedure as shown in the timing chart of FIG. 4B.

(2-1) A row of a read-out target is selected by the row selection circuit 502.

(2-2) Reset operation of the pixel output line 107: The reset means 403 is turned on (the pixel output line reset pulse signal φVCLR is applied) to reset the pixel output line 107.

(2-3) Reading out the reset level of the capacitive element ($C_2$) 104: The pixel selecting switch means (X) 105 is turned on (the pixel selecting pulse φX is applied) to electrically couple the output of the source follower switch means (SF) 106, the pixel output line 107, and the coupling capacitive element (CC) 404. Subsequently, the resetting switch means (R) 108 is turned on (the reset means driving pulse φR is applied) to reset the potential of the capacitive element ($C_2$) 104 to VR.

Subsequently, the switch means (R) 108 is turned off to make the potential of the capacitive element ($C_2$) 104 floating. At this time, while thermal noise is introduced into the potential of the capacitive element ($C_2$) 104, in the present invention, this thermal noise can be removed by the following method.

By the operation of the pixel source follower circuit (circuit part 100), a signal corresponding to the potential of the capacitive element ($C_2$) 104 is read out to the pixel output line 107.

Subsequently, φRS, which is in the ON state, is turned off, thereby clamping the input voltage of the sense amplifier 405 to an intermediate potential. As a result of this operation, the thermal noise introduced when the capacitive element ($C_2$) 104 is reset and the threshold value variance of the source follower switch means (SF) 106 are removed, making it possible to detect with high accuracy the voltage change of the capacitive element ($C_2$) 104 in the next operation caused by the photoelectric charges transferred to the capacitive element ($C_2$) 104.

(2-4) The level of φS is temporally changed into a slope shape to gradually change the potential barrier relative to $C_1$ of the switch means (S). A counter clock synchronized with the level of φS that temporally changes is input to the latch 407 of the column-parallel circuit 401 through the counter signal line 408. Here, when the photoelectric charges exceeding the potential barrier and accumulated in PD and $C_1$ start to be transferred to $C_2$, the potential of $C_2$ decreases and pixel output decreases. The important point here is that the time at which the pixel output starts to decrease changes according to the amount of photoelectric charges accumulated in PD and $C_1$. The decrease in the potential of the pixel output line 107 is transmitted to the input level of the sense amplifier 405 via the coupling capacity (CC) and, when a change exceeding the threshold value of the sense amplifier 405 occurs in the sense amplifier input level, the output of the sense amplifier 405 becomes high. The time at which the state becomes high corresponds to the photoelectric charge amount accumulated in PD and $C_1$. In the latch 407, a digital counter signal of the time at which the output of the sense amplifier 405 becomes high is held.

With the above operation, the optical signal level can be digitized and held with a simple circuit configuration. Subsequently, φS is turned off to complete the supernatant charge transfer. Here, by adjusting the change over time and change amount of φS, it is possible to adjust the AD conversion gradation value and the read-out range of the accumulated charges, that is, the read-out light quantity range.

(2-5) φR and φS are turned on to reset PD, $C_1$, and $C_2$. Subsequently, φR and φS are turned off to enter the next accumulation operation. Subsequently, φX is turned off to electrically disconnect the pixel and the pixel output line 107.

(2-6) The digital signals held in the latch 407 of the column-parallel circuit 401 are sequentially selected by the column selection circuit 503 and read out via the output buffer.

(2-7) The next row of the read-out target is selected by the row selection circuit 502.

The signal read-out of one frame of the image sensor is completed by repeating the operations (2-1) to (2-7) as described above for a predetermined number of rows.

In the present invention, the magnitude of the "effective saturation capacity" of the capacitive element ($C_1$) 102 and the magnitude of the "effective saturation capacity" of the capacitive element ($C_2$) 104 are appropriately determined in accordance with the performance required in the designed light-receiving device. In particular, in the present invention, the ratio of the magnitude of the "effective saturation capacity" of the capacitive element ($C_1$) 102 and the "effective saturation capacity" of the capacitive element ($C_2$) 104 depends on the measurement resolution and accuracy of the light-receiving device.

In the present invention, the "effective saturation capacity" of the capacitive element ($C_1$) 102 is preferably 10 to 5,000 times, and more preferably 100 to 1,000 times the "effective saturation capacity" of the capacitive element ($C_2$) 104.

In the present invention, the saturation capacity of the charge accumulation of the capacitive element ($C_2$) 104 relative to the saturation capacity of the charge accumulation of the capacitive element ($C_1$) 102 is preferably 1/100 to 1/1,000. The saturation capacity of charge accumulation is preferably 1/100 to 1/1,000.

FIG. 6 is a block diagram for explaining a configuration of an absorption analysis system 600 including the image sensor 500. The absorption analysis system 600 includes the image sensor 500, a light source 601, a signal storage and processing part 603, a display part 604, a control unit 605, and an operation part 606. A specimen 602 to be subjected to absorption analysis is arranged on an optical axis between the light source 601 and the image sensor 500. With the operation part 606 operated following the procedure described above, the absorption analysis system 600 operates by controlling the image sensor 500, the light source 601, the signal storage and processing part 603, and the display part 604 by the control unit 605.

FIG. 7 shows a flowchart of an example of an analysis procedure when analyzing a concentration body of a substance to be detected using the absorption analysis system 600.

First, the specimen 602 is set in a predetermined position in the system 600, and the system 600 is turned on (step 701). The system 600 first determines whether or not the specimen 602 is a new specimen (step 702). If the specimen 602 is not a new specimen, the process proceeds to step 705 for starting measurement. If the specimen 602 is a new specimen, the process proceeds to step 703 for selecting the light source wavelength. In step 703, an analysis optimizing light source wavelength is selected, and the process proceeds to the next step 704. In step 704, an analytical curve is acquired.

Once the analytical curve is acquired, the process proceeds to step 705 for starting concentration measurement. When start of measurement is not true, the process proceeds to the step 709 for ending the process. When start of measurement is YES, the process proceeds to step 706. In step 706, the specimen 602 is irradiated with light from the light source 601, the light quantity irradiated through the specimen 602 is received by the image sensor 500, and an optical signal based on the irradiated light quantity is obtained. The light quantity irradiated through the specimen 602 may be any of the transmitted light quantity, the reflected light quantity, and the scattered light quantity.

If the output signal output from the image sensor 500 based on the optical signal measured in step 706 is within the range of the analytical curve acquired in step 704, the analytical curve is used to derive the concentration of the substance to be detected within the specimen 602 in the region to be measured by a method such as calculation or comparison (step 708).

If the output signal output from the image sensor 500 based on the optical signal measured in step 706 is outside the range of the analytical curve acquired in step 704, the analytical curve is acquired once again in step 705, and then the process proceeds to the next step 707. When the concentration of the substance to be detected has been derived, the process proceeds to step 709 and measurement ends.

FIG. 8 is a schematic outline explanatory view when a blood glucose level in blood of a human body is measured using a scattered light imaging type absorption analysis system according to the present invention.

A light 805 having a predetermined wavelength is irradiated from a light source 802 to a predetermined position of a specimen (finger) 801 at a predetermined angle (preferably 40 to 50 degrees, more preferably 45 degrees), and a scattered light 806 that passes through the specimen (finger) 801 by the irradiation is condensed by a lens 803 and received by an image sensor 804. The blood glucose level in the blood is derived based on the output signal output from the image sensor 804 in response to this light reception.

The present invention is not limited to the above-described embodiments, and various changes and modifications can be made within the spirit and scope of the present invention.

Further, the accompanying drawings, which are incorporated in and constitute a part of the specification, illustrate embodiments of the present invention and, together with the description, serve to explain the present invention.

Therefore, to apprise the public of the scope of right of the present invention, the following claims are attached.

DESCRIPTIONS OF REFERENCE NUMERALS

100 Circuit part of light-receiving pixel
101 Light-receiving element
102 Capacitive element
103 Charge transferring switch means
18
104 Capacitive element
105 Pixel selecting switch means
106 Source follower switch means
107 Pixel column output signal line
108 Resetting switch means
300 Image sensor main part
301 Column-parallel circuit
302 Current source
303 Pixel output line reset means
304S, 304N Sample holding capacitive element
305S, 305N Write selecting means of sample holding capacitive element
306S, 306N Read-out selecting means of sample holding capacitive element
307S, 307N Output line
308 Column selection circuit output line
400 Image sensor main part
401 Column-parallel circuit
402 Current source
403 Pixel output line reset means
404 Coupling capacitive element
405 Sense amplifier
406 Sense amplifier reset means
407 Latch
408 Counter signal line
409 Output line
410 Column selection circuit output line
500 Image sensor
501 Pixel array
502 Row selection circuit
503 Column selection circuit
504 Column-parallel circuit array
505 Output buffer
506 Signal output terminal
600 Absorption analysis system
601 Light source
602 Specimen
603 Signal storage and processing part
604 Display part
605 Control unit
606 Operation part
701 to 709 Step
801 Specimen
802 Light source
803 Lens
804 Image sensor
805 Irradiated light
806 Scattered light

What is claimed is:

1. A method for reading out a signal of a light-receiving device comprising:
   a light-receiving pixel including
   a light-receiving element,
   a first capacitive element that accumulates a photoelectric charge produced by light received by the light-receiving element,
   a second capacitive element for charge-voltage conversion that accumulates a transferred portion of an amount of the photoelectric charge accumulated in the first capacitive element,
   a switch for turning on and off a photoelectric charge transfer operation from the first capacitive element to the second capacitive element,
   a resetting switch for resetting the first capacitive element and the second capacitive element,
   a pixel selecting switch, and
   a source follower switch,
   an effective saturation capacity of the first capacitive element being 10 to 5,000 times an effective saturation capacity of the second capacitive element,
   the method comprising:
   after resetting the light-receiving device as necessary, irradiating light having a light quantity capable of producing a photoelectric charge amount necessary and sufficient to fill the effective saturation capacity of the first capacitive element onto the light-receiving element to fill a capacity of the first capacitive element with a photoelectric charge produced in the light-receiving element up to the effective saturation capacity;
   turning on the pixel selecting switch to select the light-receiving pixel;
   transferring and accumulating from the first capacitive element into the second capacitive element a charge amount exceeding a potential barrier relative to the first capacitive element during transfer of a photoelectric charge from the first capacitive element to the second capacitive element by the switch;
   turning on the pixel selecting switch to output from the light-receiving pixel a voltage signal produced by charge-voltage conversion of the charge amount accumulated in the second capacitive element with a charge-voltage conversion gain based on a capacity of the second capacitive element; and
   discarding the photoelectric charge remaining in the first capacitive element after the transferring of the charge amount to the second capacitive element.

* * * * *